United States Patent
Chung et al.

(10) Patent No.: US 7,633,415 B2
(45) Date of Patent: Dec. 15, 2009

(54) SYSTEM AND METHOD FOR CALIBRATING DIGITAL-TO-ANALOG CONVERTORS

(75) Inventors: Shine Chung, Taipei Hsien (TW); Fu-Lung Hsueh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 458 days.

(21) Appl. No.: 11/691,872

(22) Filed: Mar. 27, 2007

(65) Prior Publication Data

US 2008/0238739 A1  Oct. 2, 2008

(51) Int. Cl.
*H03M 1/10* (2006.01)
(52) U.S. Cl. .................................. 341/120
(58) Field of Classification Search ........... 341/118, 341/119, 120, 121, 144, 145
See application file for complete search history.

(56) References Cited

U.S. PATENT DOCUMENTS

| | | | |
|---|---|---|---|
| 5,646,619 A * | 7/1997 | Daubert et al. | 341/118 |
| 5,955,980 A * | 9/1999 | Hanna | 341/120 |
| 6,130,632 A * | 10/2000 | Opris | 341/120 |
| 6,738,000 B2 * | 5/2004 | Boxho | 341/120 |
| 6,958,719 B2 * | 10/2005 | Moon | 341/135 |
| 7,076,384 B1 * | 7/2006 | Radulov et al. | 702/85 |
| 7,466,252 B1 * | 12/2008 | Radulov et al. | 341/120 |
| 2005/0184896 A1 * | 8/2005 | Li | 341/144 |
| 2006/0114138 A1 * | 6/2006 | Eloranta | 341/144 |

* cited by examiner

*Primary Examiner*—Linh V Nguyen
(74) *Attorney, Agent, or Firm*—K&L Gates LLP

(57) ABSTRACT

A system and method for calibrating a digital-to-analog converter (DAC) is disclosed, the method comprises providing a plurality of spare bits to each of a group of DAC bits that are designated for calibration, calibrating a first DAC bit of the group of DAC bits using its corresponding plurality of spare bits, and keeping a second DAC bit of the group of DAC bits unchanged while calibrating the first DAC bit.

23 Claims, 8 Drawing Sheets

SYSTEM AND METHOD FOR CALIBRATING DIGITAL-TO-ANALOG CONVERTERS

BACKGROUND

The present invention relates generally to a digital-to-analog converter, and more particularly to a system and method for providing a calibrated digital-to-analog conversion.

Digital-to-analog conversion is a process for converting information from a digital signal into an analog signal such as a voltage or a current. The digital signal can usually be represented as a binary number. A binary number system represents numeric values using two symbols, typically 0 and 1. Binary numbers are characterized by their having a different weighting for each digit (or bit), such that each bit represents an order of magnitude greater value. For a binary number, the weighting of the bit often referred to as the significance of the bit, doubles for each digit. For example, bit 1 is twice the value of bit 0 and bit 2 is twice the value of bit 1.

FIG. 1A illustrates a conventional digital-analog converter (DAC) 100 implemented in a binary-coded R-2R scheme. The binary-coded R-2R DAC 100 uses a plurality of resistors 102 each having the same resistance arranged in a "ladder" network and a switch assembly 104 connected to a digital input 110. The switch assembly 104 controls multiple current sources, which are weighted to correspond to the weighting of the bits in the digital input 110. To operate the DAC 100, a digital input 110 is coupled to the switch assembly 104. The switch assembly 104 switches the corresponding currents to the resister ladder such that a voltage is developed at the output 112. The linearity of the DAC is dependent on matching the resistors in the ladder network. For example, if the resistance value of the resistors 102 varies between them, then the output signal may not be linear. Due to variations in the manufacturing processes, the resistance values are often mismatched, so the conventional DAC 100 is typically only used for up to 8-bit resolution.

FIG. 2 is a schematic diagram illustrating a conventional segmented DAC 200. The conventional segmented DAC 200 is a combination of the conventional binary-weighted DAC 100 shown in FIG. 1A and a fully-decoded thermometer decoder 220 connected to additional current sources (I7-I13) and a plurality of latches 230. To operate the segmented DAC 200, a plurality of digital input signals (b0-b9) are coupled to the latches 230. The latches 230 connect its 7 least significant digital input signals (b0-b6) to the switches 104 of the binary-coded R-2R ladder 100, and its 3 most significant digital input signals (b7-b9) to the thermometer decoder 220. The thermometer coder 220 controls 7 identical current sources (I7-I13), each for providing a current to the resister ladder. Because the current sources (I7-I13) is controlled by the thermometer decoder 220 that is fully decoded rather than binary weighted, the noise level will be lower on the DAC output 112.

Higher level (12 to 14-bit) resolution may be achieved with the segmented DAC 200. However, it also requires a more sophisticated layout scheme and a relatively large integrated circuit area. Additionally, segmented DACs may also require calibrating to correct for manufacturing variations and nonlinearity. For these reasons, it is desirable to have an effective calibration system and method for digital-to-analog conversion such that an acceptable digital-to-analog conversion may be accomplished using less integrated circuit area and without requiring extensive calibrating.

SUMMARY

In view of the foregoing, the present disclosure is for a system and method for calibrating a digital-to-analog converter (DAC), the method comprises providing a plurality of spare bits to each of a group of DAC bits that are designated for calibration, calibrating a first DAC bit of the group of DAC bits using its corresponding plurality of spare bits, and keeping a second DAC bit of the group of DAC bits unchanged while calibrating the first DAC bit.

In one aspect of the present invention, the calibrating comprises adding one or more of the plurality of spare bits to the first DAC bit to minimize the DAC's analog output difference between a first digital input and a sum of a second digital input and a least significant bit, wherein the second digital input differs from the first digital input by the least significant bit.

In another aspect of the present invention, the calibrating comprises adding one or more of the plurality of spare bits to the first DAC bit to minimize the DAC's analog output difference between a first digital input and a product of a second digital input times two, wherein the second digital input differs from the first digital input by one order of significance.

The calibration system comprises a control logic circuit, a plurality of storage elements coupled to the control logic circuit and configured to store a plurality of spare bits, a sample-and-hold circuit configured to sample and hold first and second analog outputs from the DAC, and a comparator circuit configured to generate a control signal based on a comparison between the first and second analog outputs held by the sample-and-hold circuit, wherein the control signal is used by the control logic circuit for selectively adding one or more of the plurality of the spare bits to a predetermined digital input of the DAC.

The construction and method of operation of the invention, however, together with additional objects and advantages thereof will be best understood from the following description of specific embodiments when read in connection with the accompanying drawings.

DESCRIPTION

The present disclosure provides for a system and method for auto calibrating digital-to-analog converters (DACs) with little circuit modification and low area overhead.

Figure 1:
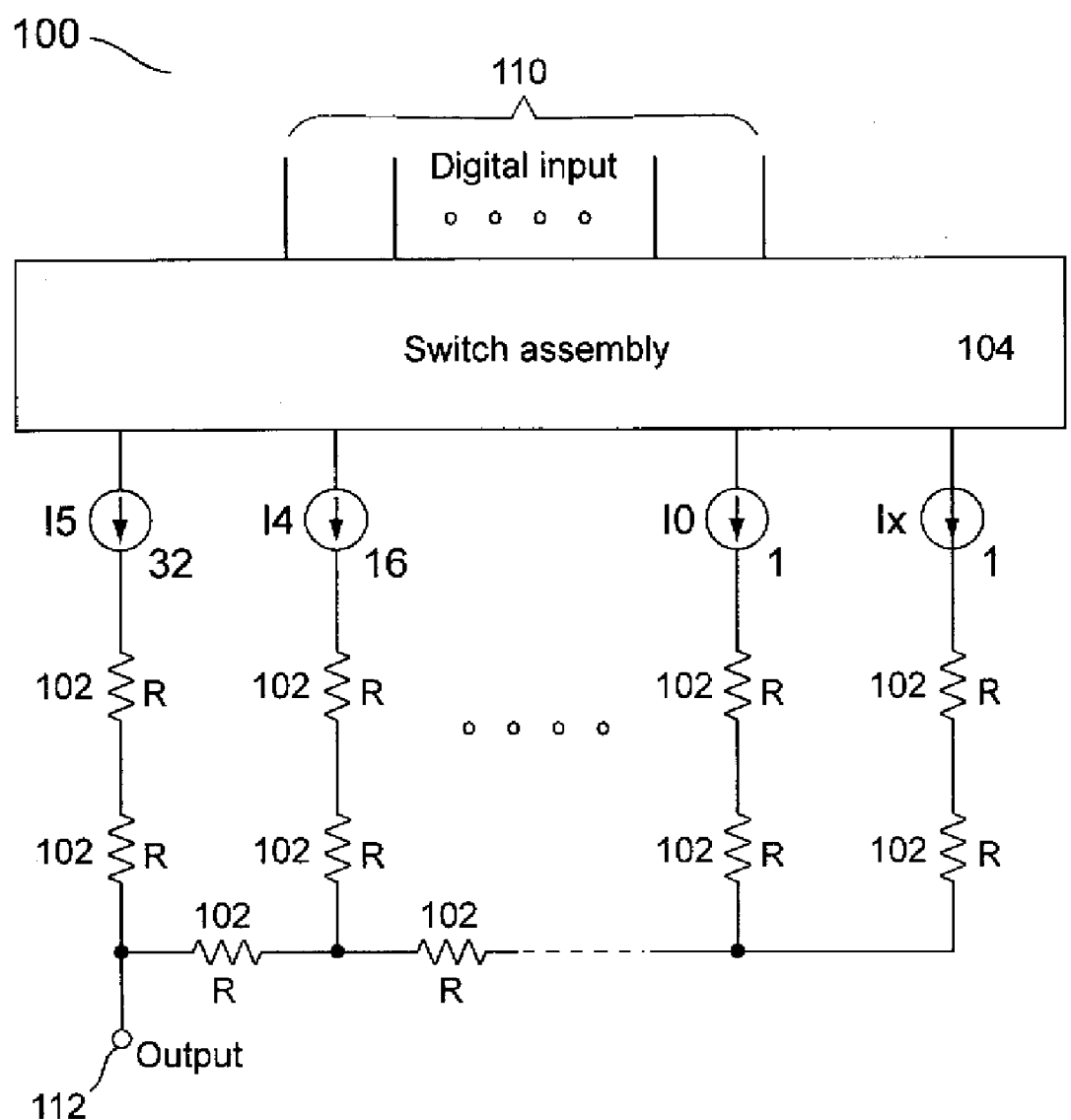
FIG. 1 is a schematic diagram illustrating a conventional binary-coded R-2R digital-to-analog converter.
Figure 2:
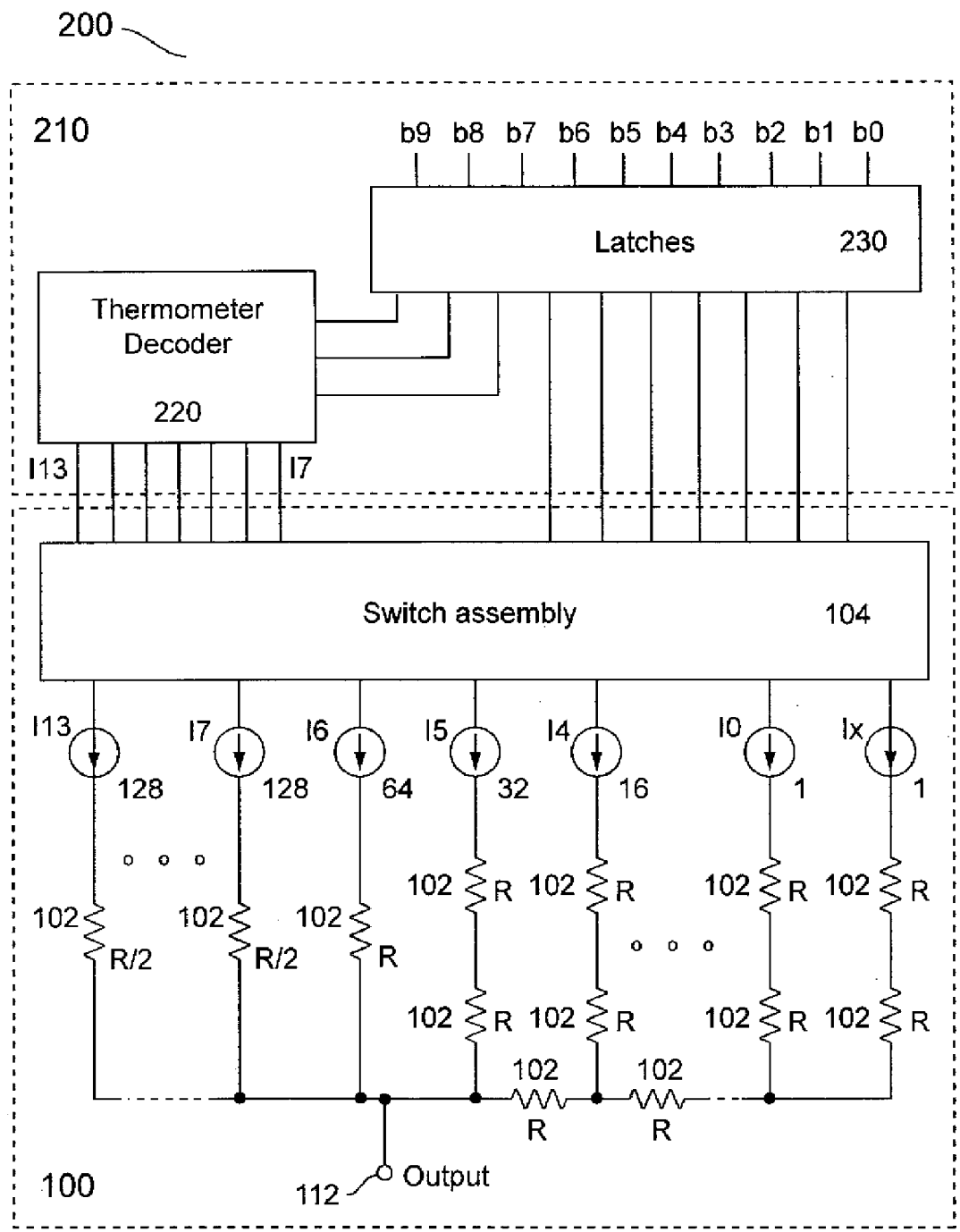
FIG. 2 is a schematic diagram illustrating a conventional segmented digital-to-analog converter.

Assuming a design target is a fully binary 12-bit DAC using R-2R scheme as shown in FIG. 1. A most significant bit (MSB) has a $2^0$ weight while the LSB has a $2^{-11}$ weight in the binary R-2R scheme as show in TABLE 1. Conventionally, achieving 12-bit accuracy through maintaining resistance matching across the 12 resistors is very difficult without utilizing any form of calibration. As an embodiment of the present invention, a method of calibrating only the five highest-order bits is described below.

TABLE 1

| Bit | Weight | Spare Bit |
|---|---|---|
| 11 | $2^0$ | ¼, ½, 1, 2, 4, 8 LSB |
| 10 | $2^{-1}$ | ¼, ½, 1, 2, 4 LSB |
| 9 | $2^{-2}$ | ¼, ½, 1, 2 LSB |
| 8 | $2^{-3}$ | ¼, ½, 1 LSB |
| 7 | $2^{-4}$ | ¼, ½ LSB |
| 6 | $2^{-5}$ | |
| 5 | $2^{-6}$ | |
| 4 | $2^{-7}$ | |
| 3 | $2^{-8}$ | |
| 2 | $2^{-9}$ | |
| 1 | $2^{-10}$ | |
| 0 | $2^{-11}$ | |
| main spare bits | $2^{-12}$ | ½ LSB |
|  | $2^{-13}$ | ¼ LSB |

Referring to TABLE 1, the upper five bits that need to be calibrated have spare bits, i.e., bit 7 has ¼ and ½ LSB as its spare bits, bit 8 has ¼, ½ and 1 LSB as its spare bits, bit 9 has ¼, ½, 1 and 2 LSB as its spare bits, bit 10 has ¼, ½, 1, 2 and 4 LSB as its spare bits, and bit 11 has ¼, ½, 1, 2, 4 and 8 LSB as its spare bits. There are a total of 20 spare bits. For calibrating the lower 7 bits, two extra main spare bits, ½ and ¼ LSB, are added in the main element. This adds up the total number of spare elements to 22.

Figure 3A:
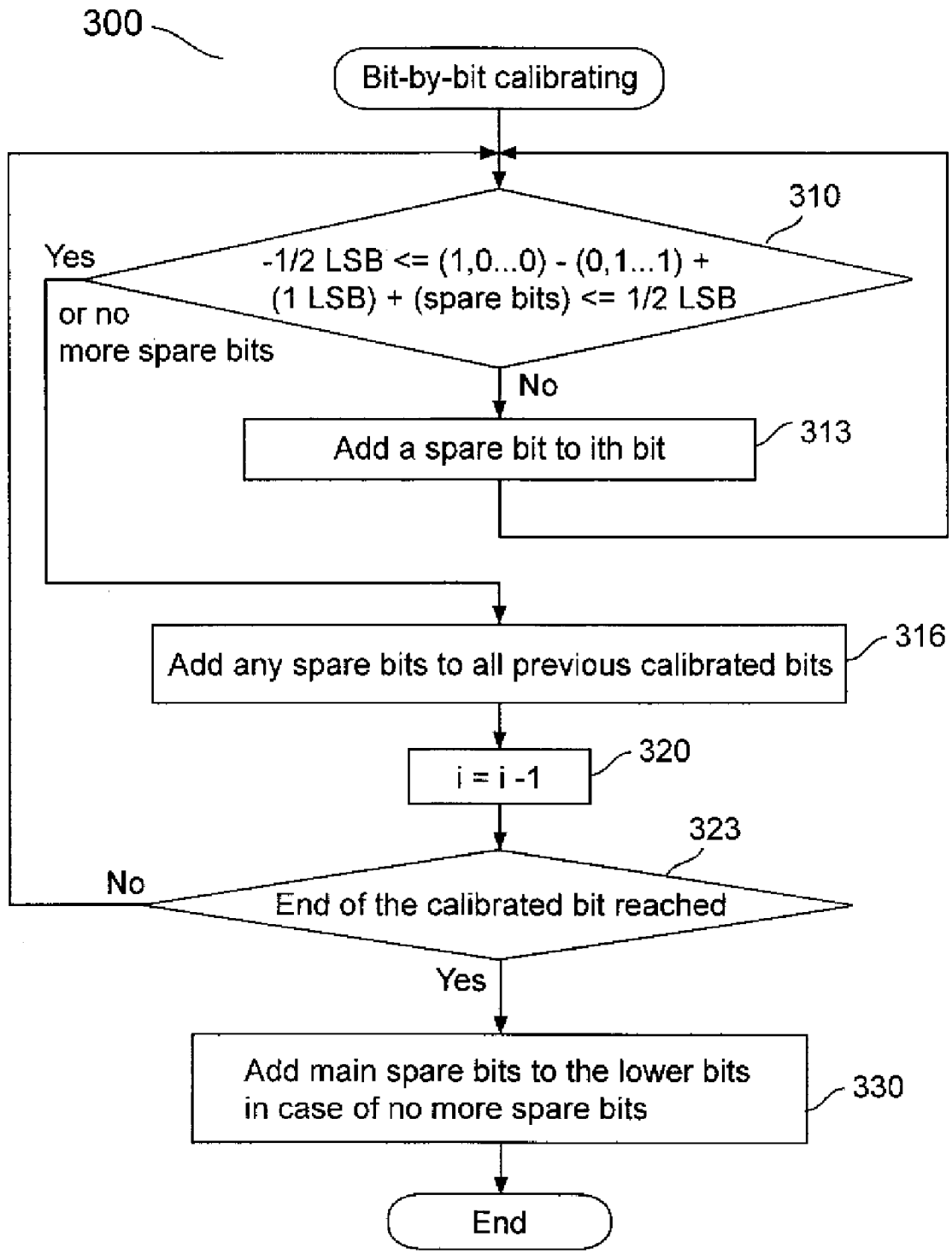
FIG. 3A is a flow chart illustrating a bit-by-bit calibrating scheme according to a first embodiment of the present invention.

FIG. 3A is a flow chart illustrating a bit-by-bit calibrating scheme 300 of the fully binary 12-bit DAC using R-2R scheme as shown in TABLE 1. The calibrating scheme is to make sure each bit has accurate strength and weights in transitioning from all 1's in lower order bits to the next higher number, for instance, for bit 7 from bit[7:0]=0111,1111 to bit[7:0]=1000,0000. Spare bits are used to patch up the bit until the following equation is met to satisfy differential non-linearity (DNL) of less than ½ LSB as shown in step 310:

$$-\tfrac{1}{2}LSB \leq (1,0\ldots 0)-(0,1\ldots 1)+(1LSB)+(\text{spare bits}) \leq \tfrac{1}{2} LSB \quad \text{(Eq. 1)}$$

Where, "(1,0 . . . 0)" represents "1000,0000", and "(0, 1 . . . 1)" represents "0111,1111" when calibrating bit 7.

If Eq. 1 is not met, i.e., bit[i:0]=1,0 . . . 0 is less than required, a spare bit will be added to the main element as shown in step 313. Steps 310 and 313 reiterates until Eq. 1 is met or no more spare bits could be added. In the bit 7 case, there are two spare bits, ¼ and ½ LSB, so that there can be a maximum of three iterations with each adding ¼, ½ or ¾ LSB.

Since the bit-by-bit calibrating scheme 300 shown in FIG. 3A starts from the highest bit, i.e., bit 11, down to the lowest calibrating bit, i.e., bit 7, if any spare bit added to a particular bit, the same amount of spare bit should also be added to all the bits higher than the particular bit as shown in step 316. Step 320 is to get ready to calibrate a next bit, and in this case to a lower bit. Step 323 is a step for checking if the calibrating scheme has completed all the bits with spare bits. If there are still more bits to be calibrated, the calibration process goes back to step 310. On the other hand, if all the bits with spare bits are calibrated, and the lowest calibrated bit, bit 7 for instance, is still higher and not meeting Eq. 1, then the main spare bits as shown in TABLE 1 will be used to step up the lowest bits that do not have their own spare bits, for instance, bit [6:0], in step 330. The calibration process 300 will end when either Eq. 1 is met for all the bits or the main spare bits are also exhausted.

Although the 12-bit DAC with only 5 highest bits equipped with spare bits is described as an embodiment of the present invention, one having skills in the art would realize that the bit-by-bit calibrating scheme 300 may be applied to DACs with any number of total bits and any number of bits having spare bits. Although starting from the highest bit is a more efficient way of calibration, the bit-by-bit calibrating scheme 300 may also be adopted for starting from the lowest bit.

Figure 3B:
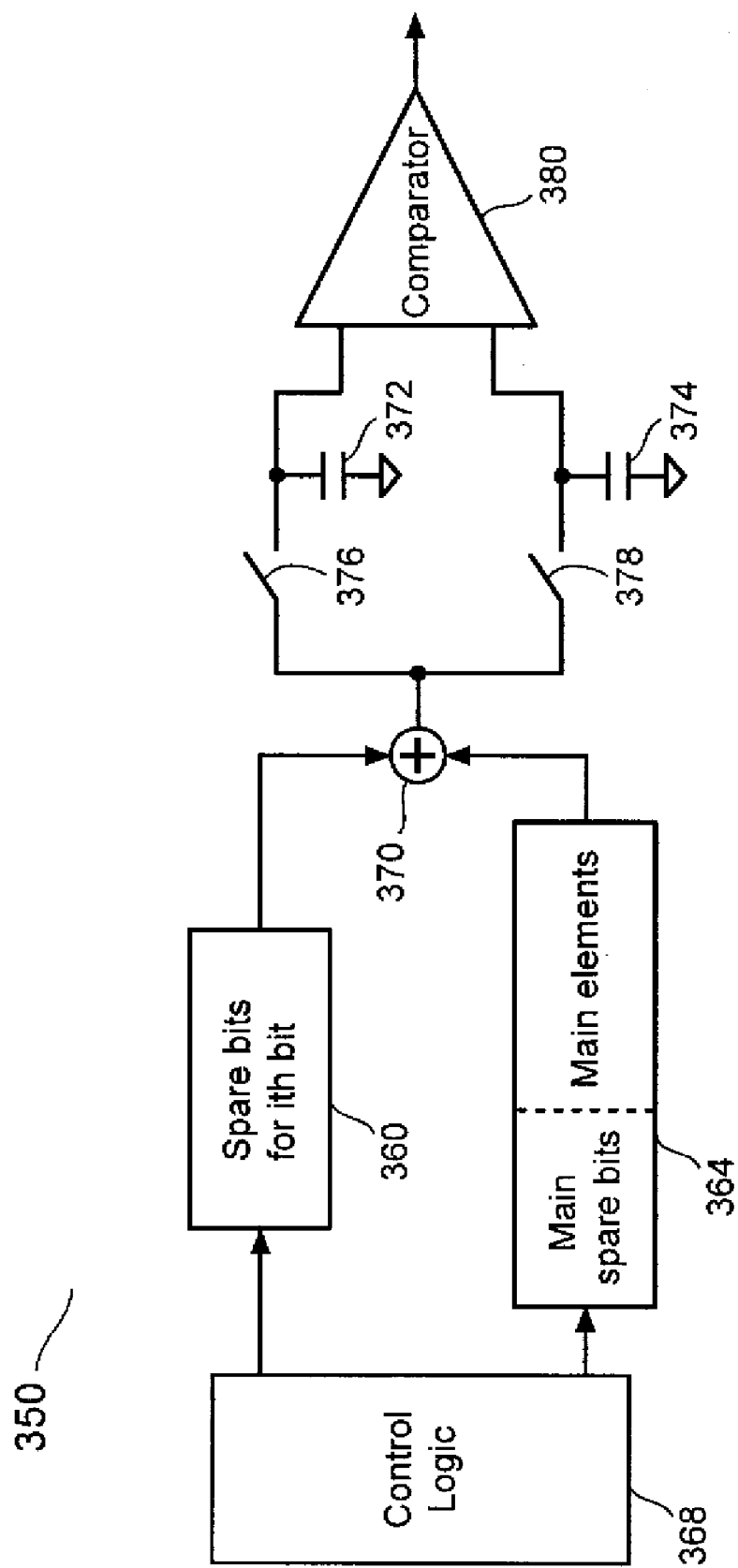
FIG. 3B is a schematic diagram illustrating a calibration circuit that implements the bit-by-bit calibrating scheme.

FIG. 3B is a schematic diagram illustrating a calibration circuit 350 that implements the bit-by-bit calibrating scheme 300. The calibration circuit 350 comprises a spare-bit block 360, a main element block 364, which both are controlled by a control logic block 368. The spare-bit block 360 may comprise a plurality of registers for storing calibrated spare bit index. The main element block 364 may include the main spare bits. When calibrating an ith bit of the binary 12-bit DAC, where i=13~7, a current generated by the spare-bit block 360 is summed up with a current generated by the main element block 364 at an adder block 370. The summed-up value is then sampled and stored in either capacitor 372 or 374 through either switch 376 or 378. If a first value of a first setting is stored in the capacitor 372, then a second value of a second setting will be stored in the capacitor 374. The first and second settings represent different numbers of spare bits that are engaged in the spare-bit block 360. A comparator 380 compares the first and second value, and generates either a "0" or "1", accordingly, to flag out whether or not more spare bits are needed. Each calibrating bit of the 12-bit DAC will run through the calibration circuit 350 for the calibrations. If after the last calibrating bit has been calibrated, and the output value of the DAC is still out of range, then the main spare bit will be used to adjust the main element values.

Figure 4A:
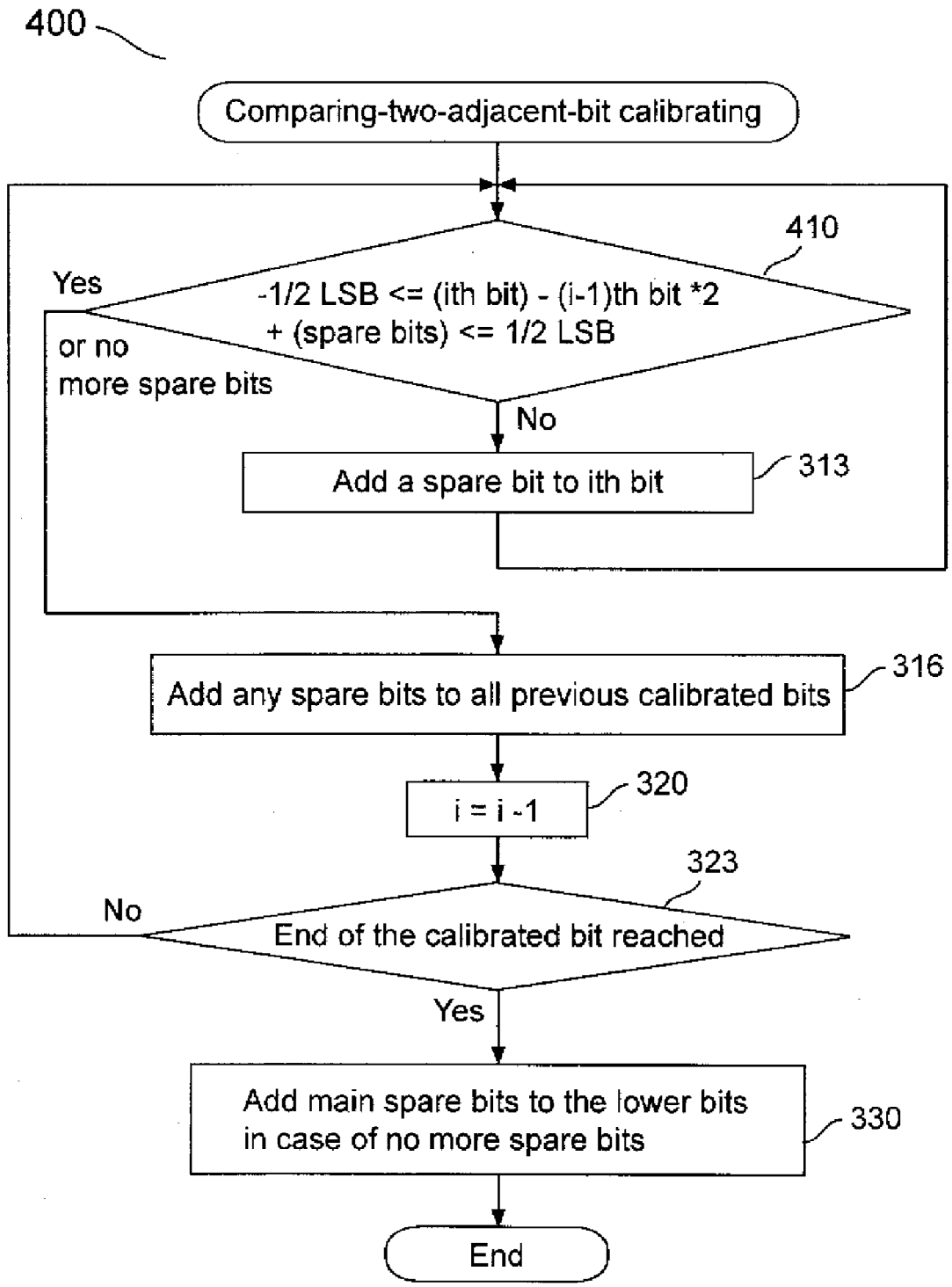
FIG. 4A is a flow chart illustrating a comparing-two-adjacent-bit calibrating scheme according to a second embodiment of the present invention.

FIG. 4A is a flow chart illustrating a comparing-two-adjacent-bit calibrating scheme 400 according to a second embodiment of the present invention. The comparing-two-adjacent-bit calibrating scheme 400 compares a bit with its next lower bit times two, and checks if their difference meets the ½ LSB criteria;

$$-\tfrac{1}{2}LSB <= (ith \text{ bit})-(i-1)th \text{ bit}*2+(\text{spare bits}) <= \tfrac{1}{2} LSB \quad \text{(Eq. 2)}$$

as shown in step 410. As an example, the ith bit may be bit 11, and the (i−1)th bit may be bit 10. The rest of the steps in the comparing-two-adjacent-bit calibrating scheme 400 is identical with the bit-by-bit calibrating scheme 300 shown in FIG. 3A. Referring to FIG. 4A, although a spare bit is added to the ith bit in step 313, one having skills in the art would appreciate that the spare bit may be added to the (i−1)th bit that helps Eq. 2 to be met.

Once bit 11 is calibrated, the bit 10 will be calibrated by comparing bit 10 with bit 9. Referring to FIG. 4A, steps 410 and 313 repeat until a last calibrated bit, e.g., bit 7 in TABLE 1, is reached.

Figure 4B:
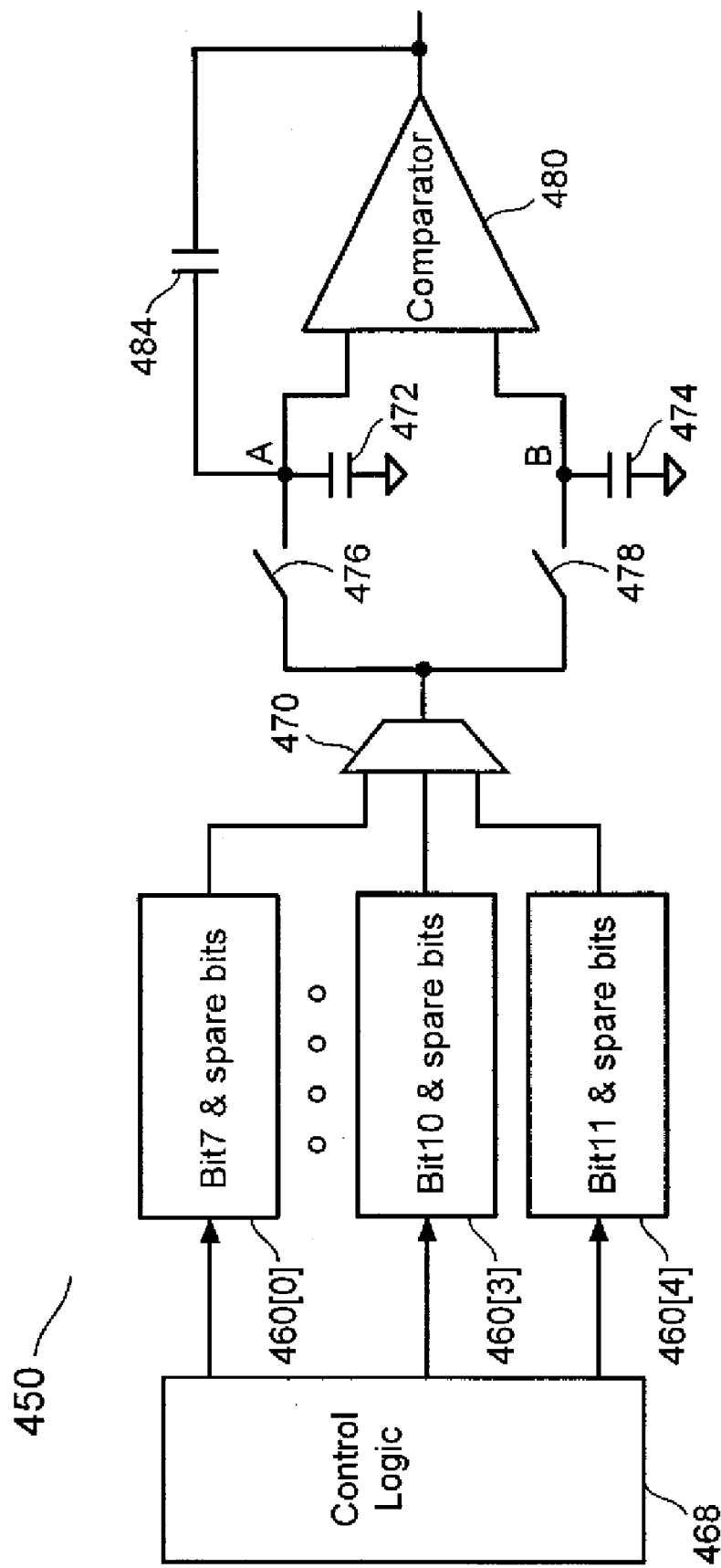
FIG. 4B is a schematic diagram illustrating a calibration circuit that implements the comparing-two-adjacent-bit calibrating scheme.

FIG. 4B is a schematic diagram illustrating a calibration circuit 450 that implements the comparing-two-adjacent-bit calibrating scheme 400. The calibration circuit 450 is designed for calibrating the fully binary 12-bit DAC shown in TABLE 1. Therefore, it comprises a plurality of individual bit blocks 460[0:4] controlled by a control logic block 468. Each individual bit block 460[i], i=0~4, comprises a DAC circuit and registers for storing spare bits for that particular bit. During a calibration process, two adjacent bit blocks 460[i] and 460[i−1] subsequently supply current through a multiplexer 470 and switches 476 and 478 to either capacitors 472 and 484 or capacitor 474. The capacitor 484 functions as a feedback path for an operational amplifier 480. Capacitances of the capacitors 472 and 484 are chosen to be the same, thus a charge stored at node A is essentially doubled. Therefore, current from a lower bit of a pair of adjacent bits being calibrated is always stored at node A by the capacitors 472 and 484. Current from a higher bit of the pair of adjacent bits is then stored at node B by the capacitor 474. Voltages at nodes A and B are compared by the operational amplifier 480, which will generate a signal to determine whether a spare bit should be added to either the higher bit or the lower bit to satisfy Eq. 2.

FIG. 5 is a block diagram illustrating a static random access memory (SRAM) 510 being used for indexing spare elements according to a third embodiment of the present invention. Again, this embodiment of the present invention is applied to the fully binary 12-bit DAC with 7 highest bits having spare bits as shown in TABLE 1. Referring to FIG. 5, the SRAM 510 has a 12-bit input BIT[11:0] and a 7-bit output 520. Then a required capacity of the SRAM 510 will be 2¹⁴×7 or 4K×7. For each digital input the SRAM 510 supplies a unique calibrated spare bit index OUTPUT[6:0] at the 7-bit output 520, which is then added with the digital input Bit[11:0] by a special adder block 530. The adder block 530 sums OUTPUT[6:2] and BIT[11:0], and then appends output[1:0] to the least significant bit of the sum, and forms a CBIT[13:0]. The reason for creating the extra two bits, CBIT[1:0] is because a converter circuit 540 has two spare bits with weights $2^{-12}$ and $2^{-13}$ respectively. If a particular digital input needing no calibration, then the OUTPUT[6:0] would be all "0". The converter circuit 540 takes in the calibrated bits, CBIT[13:0], instead of the original digital input BIT[11:0], and generates a more linear analog output.

Although the SRAM 510 is described in the third embodiment of the present invention, one having skills in the art would appreciate other types of memories, such as dynamic random access memory (DRAM) or Flash memory, may also be used to store the calibrating-spare-bit index information. The storage memory seems much larger than the required registers in the first or second embodiments of the present invention. But the memory sizes are much smaller in more advanced technologies comparing with some older process generations. The size of logic circuits can be shrunken by about 50% from one generation to the next while the analog circuit area remains almost the same.

Figure 5A:
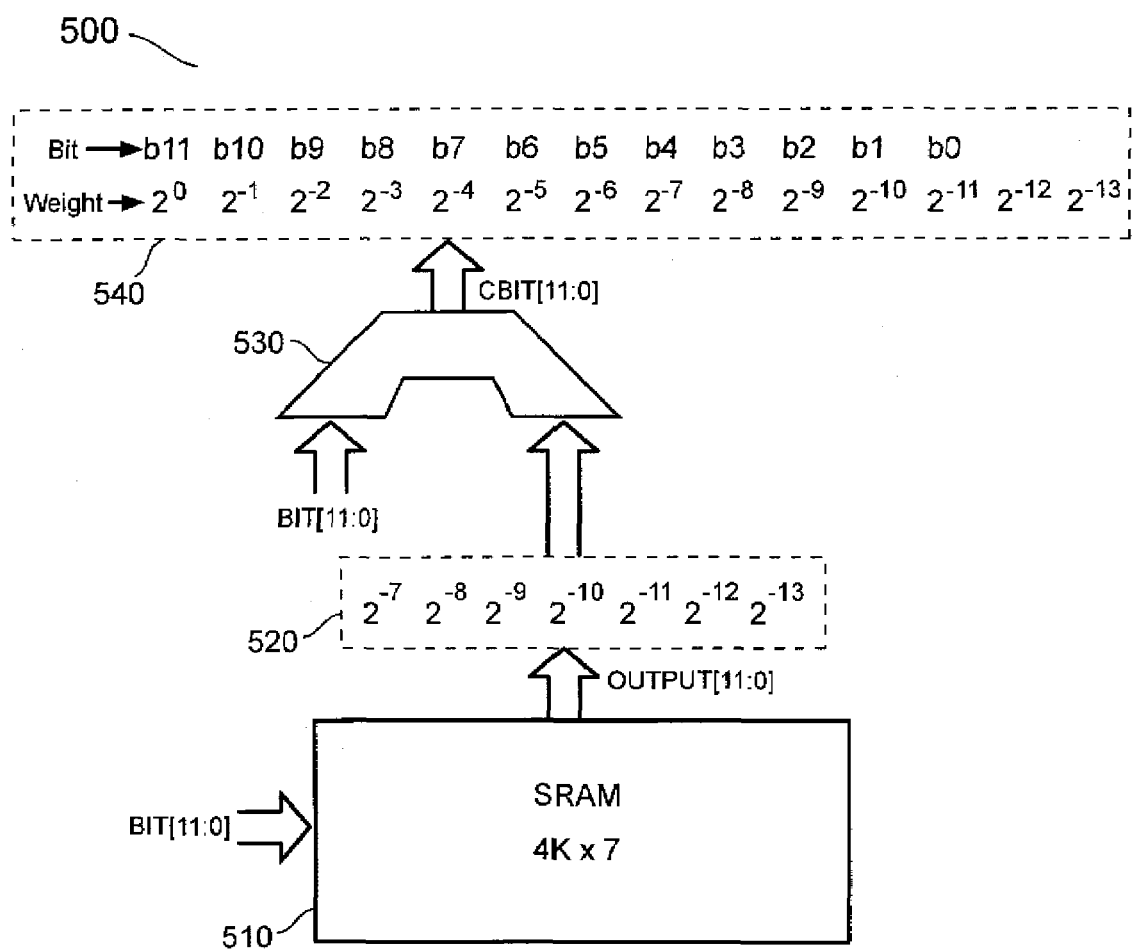
FIG. 5A is a block diagram illustrating a static random access memory (SRAM) used for indexing spare elements according to a third embodiment of the present invention.
Figure 5B:
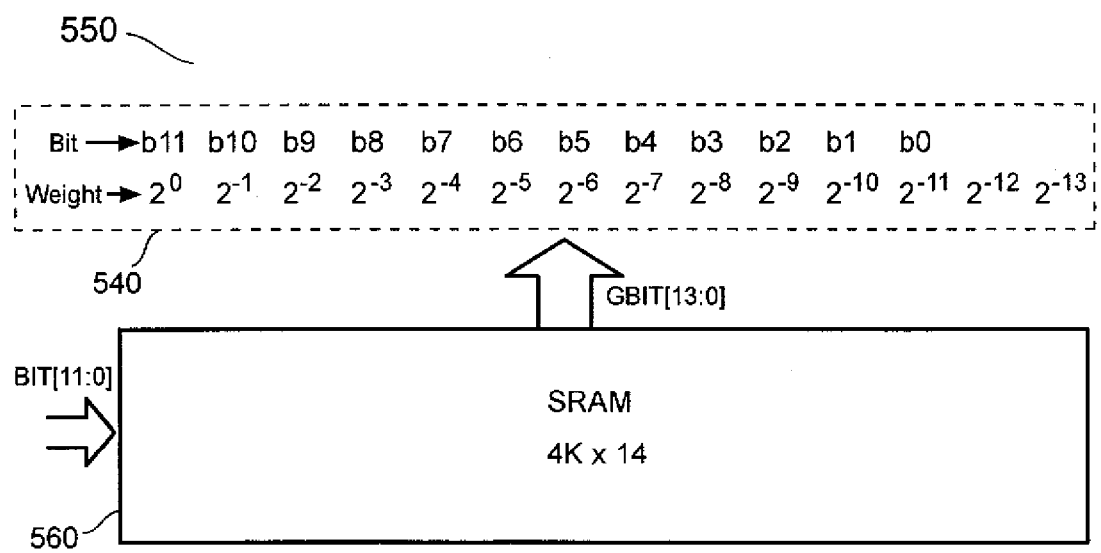
FIG. 5B is a block diagram illustrating a combined memory based calibrating system.

FIG. 5B is a block diagram illustrating a combined memory based calibrating system 550. The SRAM module 560 actually comprises a 12-bit gamma correction table as well as the calibration circuitries 510 and 530 as shown in FIG. 5A. Therefore, an output GBIT[13:0] from the SRAM module 560 contains not only calibrated digital input, but also gamma correction information. The gamma correction table usually comes with a random access memory DAC (RAM-DAC) in most display devices. Therefore, the area overhead of such calibrating system 550 can be greatly reduced. It is also apparent to people having skills in the art, that the calibrating index information can not only be combined with gamma correction information, but can also be combined with other information.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for calibrating a digital-to-analog converter (DAC), the method comprising:
   providing a plurality of spare bits to each of a group of DAC bits that are designated for calibration;
   calibrating a first DAC bit of the group of DAC bits using its corresponding plurality of spare bits; and
   keeping a second DAC bit of the group of DAC bits unchanged while calibrating the first DAC bit.

2. The method of claim 1, wherein the group of DAC bits is among the most significant bits of the DAC.

3. The method of claim 1, wherein the calibrating comprises adding one or more of the plurality of spare bits to the first DAC bit to minimize the DAC's analog output difference between a first digital input and a sum of a second digital input and a least significant bit, wherein the second digital input differs from the first digital input by the least significant bit.

4. The method of claim 3, wherein the first digital input comprises all "1s" in DAC bits less significant than the first DAC bit, and all "0s" in DAC bits more significant than and equal to the first DAC bit, wherein the second digital input is larger than the first digital input.

5. The method of claim 3, wherein the first digital input comprises a single "1" at the first DAC bit, and all "0s" for all the rest of the DAC bits, wherein the second digital input is smaller than the first digital input.

6. The method of claim 1, wherein the calibrating comprises adding one or more of the plurality of spare bits to the first DAC bit to minimize the DAC's analog output difference between a first digital input and a product of a second digital input times two, wherein the second digital input differs from the first digital input by one order of significance.

7. The method of claim 6, wherein the first digital input is larger than the second digital input.

8. The method of claim 6, wherein the first digital input is smaller than the second digital input.

9. The method of claim 1 further comprising providing a memory for storing a plurality of spare bit indexes which correspond to each individual digital input.

10. The method of claim 9, wherein the plurality of spare bit indexes contains one or more predetermined correction information.

11. The method of claim 10, wherein the predetermined correction information is gamma correction information.

12. The method of claim 1 further comprising providing one or more spare bits for calibrating the DAC bits other than the group of DAC bits that are designated for calibration.

13. A method for calibrating a digital-to-analog converter (DAC), the method comprising:
   providing a plurality of spare bits to each of a predetermined group of most significant DAC bits that are designated for calibration;
   calibrating a first DAC bit of the group of DAC bits using its corresponding plurality of spare bits; and
   keeping a second DAC bit of the group of DAC bits unchanged while calibrating the first DAC bit.

14. The method of claim 13, wherein the calibrating comprises adding one or more of the plurality of spare bits to the first DAC bit to minimize the DAC's analog output difference between a first digital input and a sum of a second digital input and a least significant bit, wherein the second digital input differs from the first digital input by the least significant bit.

15. The method of claim 13, wherein the calibrating comprises adding one or more of the plurality of spare bits to the first DAC bit to minimize the DAC's analog output difference between a first digital input and a product of a second digital input times two, wherein the second digital input differs from the first digital input by one order of significance.

16. The method of claim 13 further comprising providing one or more spare bits for calibrating the DAC bits other than the group of DAC bits that are designated for calibration.

17. A calibration circuit for a digital-to-analog converter (DAC), the calibration circuit comprising:
- a control logic circuit;
- a plurality of storage elements coupled to the control logic circuit and configured to store a plurality of spare bits;
- a sample-and-hold circuit configured to sample and hold a first and second analog output from the DAC; and
- a comparator circuit configured to generate a control signal based on a comparison between the first and second analog outputs held by the sample-and-hold circuit,
- wherein the control signal is used by the control logic circuit for selectively adding one or more of the plurality of the spare bits to a predetermined digital input of the DAC.

18. The calibration circuit of claim 17, wherein the first and second analog outputs are generated from a first and second digital input, respectively, wherein the first and second digital input differs from each other by a least significant bit.

19. The calibration circuit of claim 17 further comprising a multiplied-by-two circuits wherein the first and second analog outputs are generated from a first and second digital input, respectively, wherein the first and second digital input differs from each other by an order of magnitude.

20. The calibration circuit of claim 19, wherein the multiplied-by-two circuit comprises:
- an operational amplifier; and
- a capacitor forming a feedback path for the operational amplifier.

21. The calibration circuit of claim 17, wherein the sample-and-hold circuit comprises at least two switch-and-capacitor modules for sampling and holding the first and second analog outputs separately.

22. The calibration circuit of claim 17 further comprising a memory module configured to store calibrated bit indexes for one or more digital inputs.

23. The calibration circuit of claim 22, wherein the calibrated bit indexes contain one or more predetermined correctional information.

* * * * *